United States Patent
Murthy et al.

(10) Patent No.: US 7,226,842 B2
(45) Date of Patent: Jun. 5, 2007

(54) FABRICATING STRAINED CHANNEL EPITAXIAL SOURCE/DRAIN TRANSISTORS

(75) Inventors: Anand Murthy, Portland, OR (US); Justin K. Brask, Portland, OR (US); Andrew N. Westmeyer, Beaverton, OR (US); Boyan Boyanov, Portland, OR (US); Nick Lindert, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 185 days.

(21) Appl. No.: 10/780,826

(22) Filed: Feb. 17, 2004

(65) Prior Publication Data

US 2005/0179066 A1 Aug. 18, 2005

(51) Int. Cl.
*H01L 21/20* (2006.01)
*H01L 21/8234* (2006.01)

(52) U.S. Cl. ............... 438/299; 438/478; 438/482; 438/738

(58) Field of Classification Search ........... 438/197, 438/300
See application file for complete search history.

(56) References Cited

U.S. PATENT DOCUMENTS

| | | | | |
|---|---|---|---|---|
| 5,498,578 A | * | 3/1996 | Steele et al. | 438/400 |
| 6,011,277 A | * | 1/2000 | Yamazaki | 257/66 |
| 6,224,713 B1 | * | 5/2001 | Hembree et al. | 156/345.11 |
| 6,746,967 B2 | * | 6/2004 | Brask et al. | 438/752 |
| 6,770,568 B2 | * | 8/2004 | Brask | 438/746 |
| 6,797,622 B2 | * | 9/2004 | Brask et al. | 438/689 |
| 6,858,483 B2 | * | 2/2005 | Doczy et al. | 438/199 |
| 6,946,350 B2 | * | 9/2005 | Lindert et al. | 438/285 |
| 2002/0034864 A1 | * | 3/2002 | Mizushima et al. | 438/486 |
| 2004/0097047 A1 | * | 5/2004 | Natzie et al. | 438/300 |
| 2005/0111806 A1 | * | 5/2005 | Brask et al. | 385/129 |

OTHER PUBLICATIONS

Stanley Wolf Silicon Processing for the VSLI Era vol. 1 Lattice Press 1986 (pp. 142, 169, and 179).*

* cited by examiner

*Primary Examiner*—Stephen W. Smoot
(74) *Attorney, Agent, or Firm*—Trop, Pruner & Hu, P.C.

(57) ABSTRACT

The mobility of carriers may be increased in strained channel epitaxial source/drain transistors. Doped silicon material may be blanket deposited after removing ion implanted source/drain regions. The blanket deposition forms amorphous films over non-source/drain areas and crystalline films in source/drain regions. By using an etch which is selective to amorphous silicon, the amorphous material may be removed. This may avoid some problems associated with selective deposition of the doped silicon material.

13 Claims, 2 Drawing Sheets

FABRICATING STRAINED CHANNEL EPITAXIAL SOURCE/DRAIN TRANSISTORS

BACKGROUND

This invention relates generally to the fabrication of integrated circuits.

Transistors utilized in logic circuits have a current drive that is proportional to the mobility of charge carriers. Current drive is related to speed. Thus, it is desirable to improve the mobility of charge carriers.

It is known to use strained channel epitaxial source/drain transistors for the p-channel transistors. The source and drain are formed by ion implantation. The implanted source/drain is then removed using an etching process. A germanium doped silicon material is then selectively deposited into the source/drain regions.

Because germanium expands as it becomes epitaxial, it compresses the channel between source and drain, increasing the mobility of the charge carriers through the channel. However, the need for selective deposition of the epitaxial source/drain raises yield concerns.

Thus, it would be desirable to have alternate ways to form strained channel epitaxial source/drain transistors.

DETAILED DESCRIPTION

Figure 1:
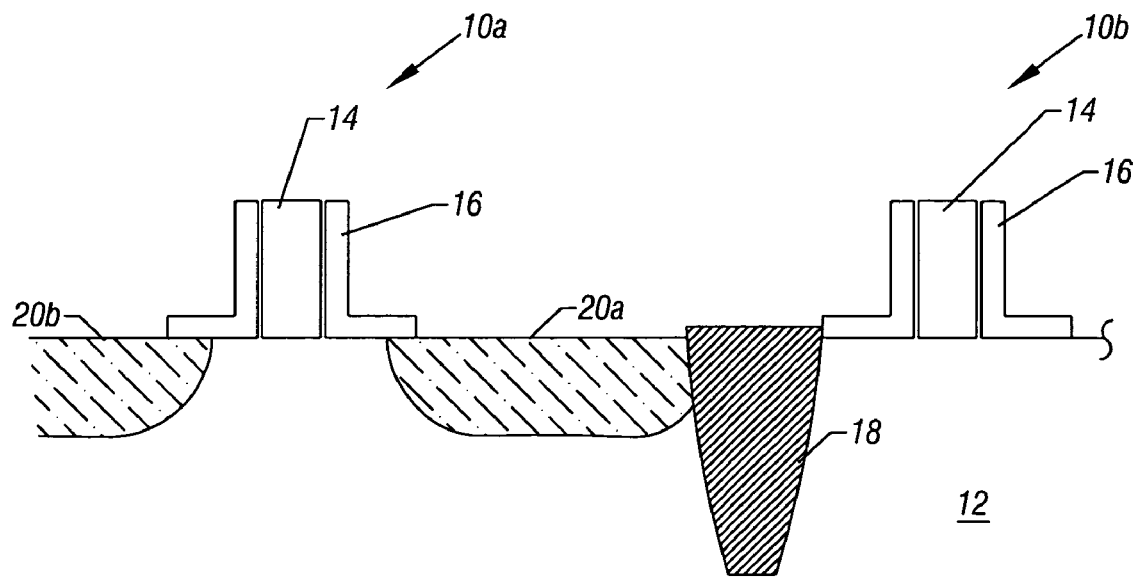
FIG. 1 is a greatly enlarged, cross-sectional view at an early stage of manufacture in accordance with one embodiment of the present invention.

Referring to FIG. 1, a pair of transistors 10a and 10b may be formed in a semiconductor substrate 12. The transistors 10a and 10b may both be PMOS or one may be NMOS and one may be PMOS. Initially, source/drains 20a and 20b are formed in the substrate 12 using a gate electrode structure as a mask. The gate electrode structure may include a gate electrode 14 and sidewall spacers 16. An isolation trench 18 may electrically isolate the transistor 10a from the transistor 10b.

Figure 2:
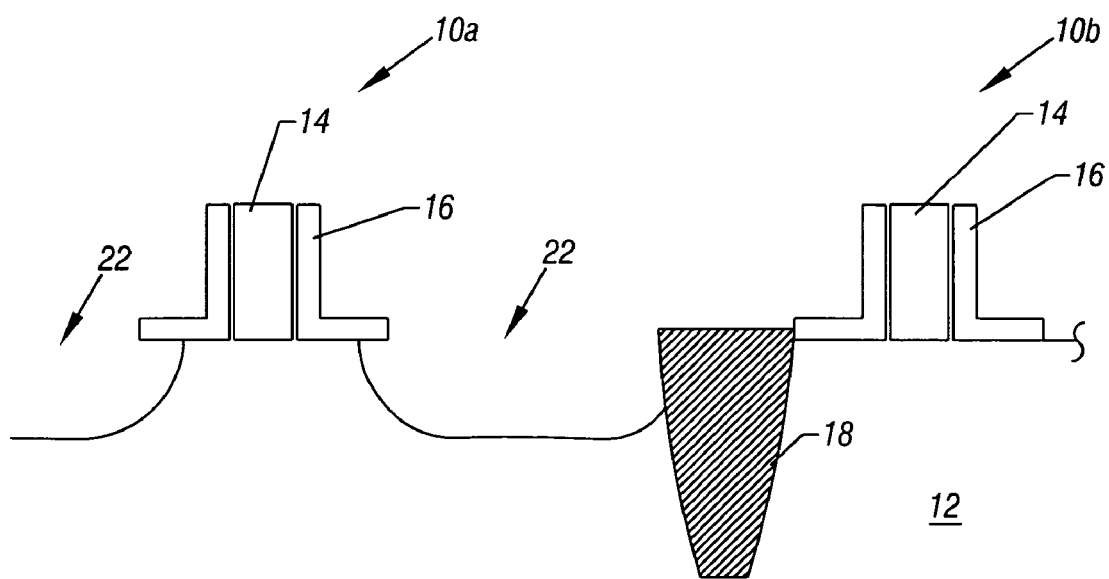
FIG. 2 is a greatly enlarged, cross-sectional view corresponding to FIG. 1 at a subsequent stage of manufacture in accordance with one embodiment of the present invention.

Referring next to FIG. 2, the implanted source/drains 20a and 20b may then be removed using a well known dry etch, leaving depressions 22 at the locations where the source/drains previously existed.

Figure 3:
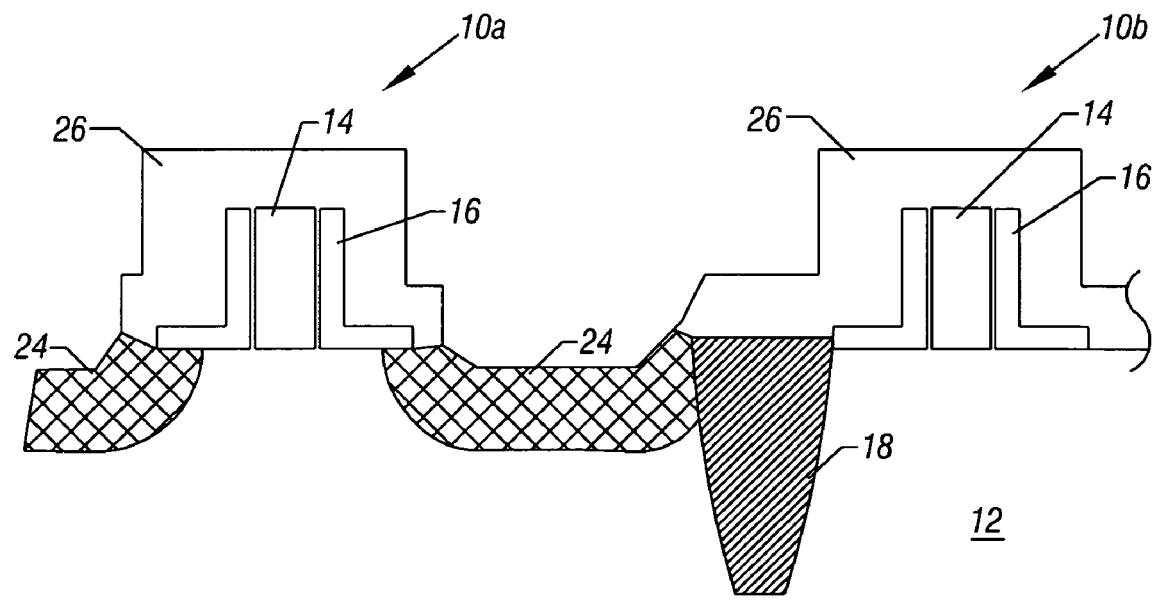
FIG. 3 is a greatly enlarged, cross-sectional view corresponding to FIG. 2 at a subsequent stage of manufacture in accordance with one embodiment of the present invention.

Referring to FIG. 3, in the case of an NMOS transistor, carbon doped silicon film 24 may be blanket deposited over the active area of the transistor 10a. The blanket deposition may be a chemical vapor deposition using trisilane, methyl silane, and $H_2$ at a deposition temperature less than 550° C. in one embodiment. At these temperatures, the film 24 is rendered epitaxial on the exposed silicon regions 22 and is amorphous on oxide and nitride areas such as the sidewall spacer 16. The carbon doped silicon film 24 may also be in situ doped with phosphorous or arsenic during deposition in one embodiment.

In a single wafer 300 millimeter rapid thermal chemical vapor deposition (RTCVD) reactor, a chemistry of 20 sccm of trisilane, 30 sccm of mono-methyl silane, 20 slm of $H_2$, at 550° C., and 15 Torr pressure for 12 minutes produces a 50 nanometer carbon doped silicon film 24 with a fully substituted carbon concentration of 3E20 $cm^{-3}$.

An amorphous layer 26 is formed in regions not in contact with the silicon substrate 12. Thus, the amorphous layer 26 covers the gate electrode 14 and sidewall spacer 16. One reason for the formation of crystalline material 24 in the substrate 12 is that, in the substrate, the silicon continues to grow epitaxially expanding the existing lattice. However, there is no existing lattice to support growth of the crystalline film over areas outside the silicon substrate 12.

In the case of the PMOS transistors, a boron doped silicon germanide film may be deposited non-selectively after etching out the implanted sources and drains. An amorphous film 26 forms over oxide and nitride areas while a crystalline film 24 forms within the substrate 12.

Figure 4:
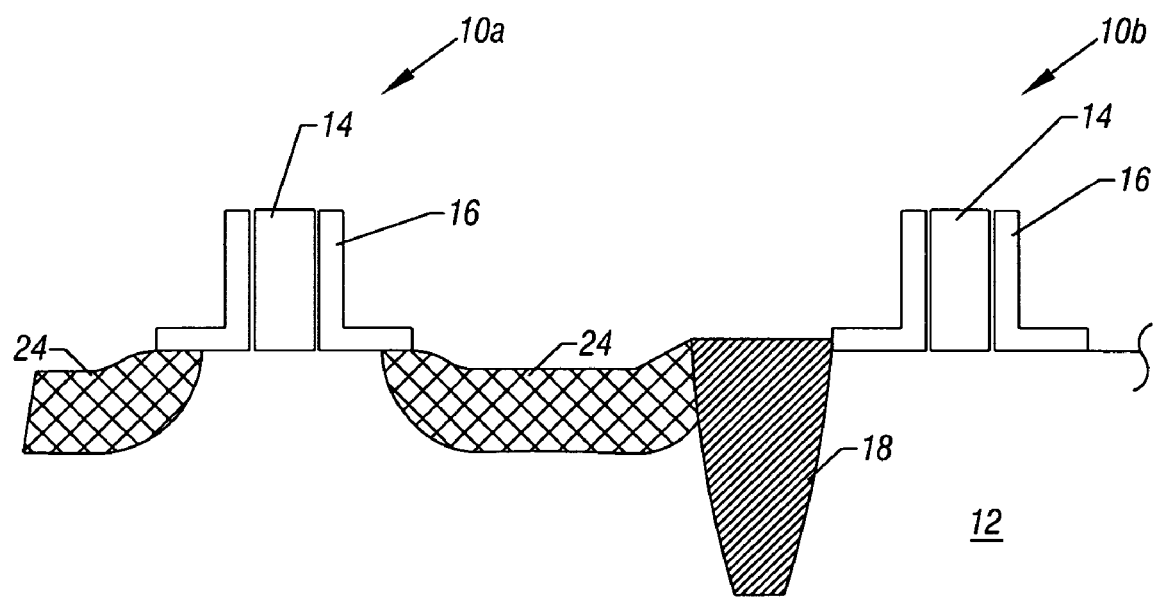
FIG. 4 is a greatly enlarged, cross-sectional view corresponding to FIG. 3 at a subsequent stage of manufacture in accordance with one embodiment of the present invention.

Then, as shown in FIG. 4, in both the NMOS and PMOS examples, the amorphous film 26 is selectively etched away without adverse consequences to the epitaxial source/drain film 24. Selectivity to amorphous silicon over crystalline silicon may be achieved by tailoring the etch chemistry utilizing differences in the activation energy towards forming the dissolution products. Where a film crystallizes a lot of energy is gained. The etch may be tuned so it does not overcome the activation barrier needed to etch material in the crystalline phase.

Highly carbon doped crystalline silicon provides the barrier to remove the dissolution products due to non-degeneracy in the lattice. Amorphous film (doped or undoped) has insufficient lattice energy to overcome the activation barrier.

A chemistry comprising 15% $NH_4OH$ in deionized water with sonication is effective in removing the amorphous silicon without etching the doped crystalline silicon. As another example, 25% tetramethylammonium (TMAH) in deionized water also with sonication may be used.

In one embodiment, the sonication may involve the application of sonic energy in the frequency range between approximately 10 kilohertz (kHz) and 100 kilohertz. In a second embodiment, the sonication may be megasonic, namely the application of sonic energy in the frequency range between approximately 500 and 1000 kilohertz. The etching may be performed in a wet etch bath. The wet etch may be performed by a immersing a wafer in an etchant. For example, the wafer or wafers may be immersed in a tank, such as a chemical bath, that is equipped with sonication. The equipment for sonication may vary, but in one embodiment using ultrasonic or megasonic frequencies, transducers located external to the tank may provide sonic waves at the desired frequency.

Once the amorphous silicon 26 has been removed, the highly carbon doped silicon film 24 is retained in the N+ source/drain regions. Likewise, the boron doped silicon film 24 may be retained in P+ source/drain regions. The remaining fabrication may use standard CMOS fabrication steps, including source/drain lithography, source/drain implants, rapid thermal anneals, and salicide formations, in one embodiment.

As a result, high tensile strain can be generated in the NMOS transistor channel and high compressive strain may be generated in the PMOS transistor channel, thereby realizing mobility and performance gains. Because of the non-selective epitaxial deposition, simplicity and flexibility may be achieved in some embodiments. Yield risks associated with selective deposition may be reduced in some applications.

In the case of the NMOS transistors, a relatively high concentration of carbon may be obtained during the blanket or non-selective deposition. The higher substitutional carbon results in greater channel mobility.

In addition, chlorine containing silicon precursors are not needed in some embodiments of the present invention. Avoiding the need for chlorine containing silicon precursors increases the deposition rate in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   blanket depositing a mobility enhancing silicon material over a region of a semiconductor substrate to form amorphous and crystalline films;
   selectively removing the amorphous film without substantially removing the crystalline film; and
   forming a strained channel MOS transistor with said crystalline film forming at least part of a source and drain.

2. The method of claim 1 including blanket depositing a material to enhance compressive strain.

3. The method of claim 1 including blanket depositing a material to enhance tensile strain.

4. The method of claim 1 including blanket depositing a carbon doped silicon material.

5. The method of claim 1 including blanket depositing a boron doped silicon material.

6. The method of claim 1 wherein selectively removing includes etching in the presence of sonic ation.

7. The method of claim 6 including etching using tetramethylammonium.

8. The method of claim 6 including etching using $NH_4OH$.

9. The method of claim 1 wherein blanket depositing includes depositing using trisilane.

10. The method of claim 9 including depositing using trisilane at a temperature less than 550° C.

11. The method of claim 1 including forming a strained channel NMOS transistor.

12. The method of claim 1 including forming a strained channel PMOS transistor.

13. The method of claim 1 including removing ion implanted source/drain regions and blanket depositing a mobility enhancing silicon material in place of said removed source/drain regions and over gate electrode regions.

* * * * *

UNITED STATES PATENT AND TRADEMARK OFFICE
CERTIFICATE OF CORRECTION

PATENT NO. : 7,226,842 B2
APPLICATION NO. : 10/780826
DATED : June 5, 2007
INVENTOR(S) : Anand Murthy et al.

It is certified that error appears in the above-identified patent and that said Letters Patent is hereby corrected as shown below:

Column 4:
Line 9, "sonic ation" should be --sonication--.

Signed and Sealed this

Fourteenth Day of August, 2007

JON W. DUDAS
*Director of the United States Patent and Trademark Office*